United States Patent
Rabii

(10) Patent No.: US 9,772,494 B2
(45) Date of Patent: *Sep. 26, 2017

(54) WEARABLE DISPLAY DEVICE USE-BASED DATA PROCESSING CONTROL

(71) Applicant: QUALCOMM Incorporated, San Diego, CA (US)

(72) Inventor: Khosro Mohammad Rabii, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/873,950

(22) Filed: Oct. 2, 2015

(65) Prior Publication Data

US 2016/0025975 A1 Jan. 28, 2016

Related U.S. Application Data

(63) Continuation of application No. 14/018,131, filed on Sep. 4, 2013, now Pat. No. 9,183,612.

(51) Int. Cl.
*G09G 5/00* (2006.01)
*G06F 3/14* (2006.01)
(Continued)

(52) U.S. Cl.
CPC ........... *G02B 27/017* (2013.01); *G06F 1/163* (2013.01); *G06F 1/3231* (2013.01);
(Continued)

(58) Field of Classification Search
CPC .................................. G06F 1/165; G06F 3/011
See application file for complete search history.

(56) References Cited

U.S. PATENT DOCUMENTS 5,329,577 A 7/1994 Norimatsu
5,635,948 A 6/1997 Tonosaki
(Continued)

FOREIGN PATENT DOCUMENTS

JP 2004180162 A 6/2004
JP 2004236242 A 8/2004
(Continued)

OTHER PUBLICATIONS

Camps-Mur D., et al., "Designing energy efficient access points with Wi-Fi Direct," Computer Networks, vol. 55, May 17, 2011, pp. 2838-2855.

(Continued)

*Primary Examiner* — Kevin M Nguyen
(74) *Attorney, Agent, or Firm* — Shumaker & Sieffert, P.A.

(57) ABSTRACT

Techniques are described for controlling operation of both a host device and a wearable display device connected to the host device based on a use status of the wearable display device. The techniques include automatically determining a use status of a wearable display device based on feedback from one or more touch sensors within the wearable display device that indicates whether the wearable display device is worn by a user. Based on the determined use status, the wearable display device controls its own operation (e.g., controls operation of display screens of the wearable display device, a communication session with the host device, and display processing of data received from the host device). The wearable display device also sends an indication of the use status to the host device. The host device then controls its own data processing for the wearable display device based on the indicated use status.

30 Claims, 9 Drawing Sheets

(51) Int. Cl.

| | |
|---|---|
| *G02B 27/01* | (2006.01) |
| *G06T 1/20* | (2006.01) |
| *G06F 3/041* | (2006.01) |
| *G06F 1/16* | (2006.01) |
| *G06F 1/32* | (2006.01) |
| *G06F 3/01* | (2006.01) |
| *H03K 17/96* | (2006.01) |
| *G06F 3/044* | (2006.01) |

(52) U.S. Cl.
CPC ............ *G06F 1/3265* (2013.01); *G06F 3/011* (2013.01); *G06F 3/041* (2013.01); *G06F 3/044* (2013.01); *G06F 3/14* (2013.01); *G06T 1/20* (2013.01); *G09G 5/00* (2013.01); *G09G 5/001* (2013.01); *H03K 17/962* (2013.01); *G02B 2027/0181* (2013.01); *G06F 2203/0339* (2013.01); *G09G 2330/021* (2013.01); *G09G 2330/022* (2013.01); *G09G 2354/00* (2013.01); *G09G 2370/16* (2013.01); *H03K 2217/96071* (2013.01); *H03K 2217/960735* (2013.01); *Y02B 60/1242* (2013.01); *Y02B 60/1289* (2013.01)

(56) References Cited

U.S. PATENT DOCUMENTS

| | | | |
|---|---|---|---|
| 5,986,813 A | 11/1999 | Saikawa et al. | |
| 7,123,215 B2 | 10/2006 | Nakada | |
| 7,173,765 B2 | 2/2007 | Yamasaki | |
| 8,184,067 B1 | 5/2012 | Braun et al. | |
| 8,954,177 B2* | 2/2015 | Sanders | G06F 3/011 381/120 |
| 9,183,612 B2 | 11/2015 | Rabii | |
| 2002/0113907 A1* | 8/2002 | Endo | G09G 5/006 348/730 |
| 2006/0018027 A1 | 1/2006 | Yamasaki | |
| 2007/0086624 A1 | 4/2007 | Breed et al. | |
| 2009/0243966 A1 | 10/2009 | Kato et al. | |
| 2011/0194029 A1 | 8/2011 | Herrmann et al. | |
| 2012/0056847 A1 | 3/2012 | Milford | |
| 2012/0249797 A1 | 10/2012 | Haddick et al. | |
| 2012/0310391 A1* | 12/2012 | Sanders | G06F 3/011 700/94 |

FOREIGN PATENT DOCUMENTS

| | | |
|---|---|---|
| JP | 2006033617 A | 2/2006 |
| JP | 2009288892 A | 12/2009 |
| JP | 2012191624 A | 10/2012 |
| JP | 2013110662 A | 6/2013 |
| JP | 2013114124 A | 6/2013 |
| KR | 20040047692 A | 6/2004 |
| WO | 2011098854 A1 | 8/2011 |

OTHER PUBLICATIONS

Gast, 801.11 Wireless Networks: The Definitive Guide, Apr. 2002, O'Reilly & Associates, Inc., Apr. 2002, 436 pp.
International Search Report and Written Opinion—PCT/US2014/049814—ISA/EPO—Nov. 3, 2014, (13 pages).
Rolland, et al., "Head-Mounted Display Systems," Encyclopedia of Optical Engineering, Taylor & Francis, 2005, 14 Pages. (Applicant points out, in accordance with MPEP 609.04(a), that the year of publication, 2005, is sufficiently earlier than the effective U.S. filing date, Sep. 4, 2013, so that the particular month of publication is not in issue.).
Second Written Opinion from corresponding PCT Application Serial No. PCT/US2014/049814 dated Aug. 10, 2015 (8 pages).
International Preliminary Report on Patentability from corresponding PCT Application Serial No. PCT/US2014/049814 dated Feb. 11, 2016, (10 pages).
International Preliminary Report on Patentability from corresponding PCT Application Serial No. PCT/US2014/049814 dated Nov. 16, 2015, (10 pages).
International Preliminary Report on Patentability from corresponding PCT Application Serial No. PCT/US2014/049814 dated Jun. 3, 2016 (43 pages).

\* cited by examiner

WEARABLE DISPLAY DEVICE USE-BASED DATA PROCESSING CONTROL

This application is a continuation of U.S. application Ser. No. 14/018,131, filed Sep. 4, 2013, the entire content of which is incorporated herein by reference.

TECHNICAL FIELD

The disclosure relates to processing of multimedia data and, more particularly, control over processing of multimedia data.

BACKGROUND

Wireless display (WD) systems include at least one host device and at least one client device that communicate over a wireless network. For example, a Wi-Fi Direct (WFD) system includes multiple devices communicating over a Wi-Fi network. The host device acts as a wireless access point and sends multimedia data, which may include audio video (AV) data, audio data, and/or video data, to one or more client devices participating in a particular peer-to-peer (P2P) group communication session using one or more wireless communication standards, e.g., IEEE 802.11. The multimedia data may be played back at both a display of the host device and displays at each of the client devices. More specifically, each of the participating client devices processes the received multimedia data for presentation on its display screen and audio equipment. In addition, the host device may perform at least some processing of the multimedia data for presentation on the client devices.

The host device and one or more of the client devices may be either wireless devices or wired devices with wireless communication capabilities. In one example, as wired devices, one or more of the host device and the client devices may comprise televisions, monitors, projectors, set-top boxes, DVD or Blu-Ray Disc players, digital video recorders, laptop or desktop personal computers, video game consoles, and the like, that include wireless communication capabilities. In another example, as wireless devices, one or more of the host device and the client devices may comprise mobile telephones, portable computers with wireless communication cards, personal digital assistants (PDAs), portable media players, or other flash memory devices with wireless communication capabilities, including so-called "smart" phones and "smart" pads or tablets, or other types of wireless communication devices (WCDs).

In some examples, at least one of the client devices may comprise a wearable display device. A wearable display device may comprise any type of wired or wireless display device that is worn on a user's body. As an example, the wearable display device may comprise a wireless head-worn display or wireless head-mounted display (WHMD) that is worn on a user's head in order to position one or more display screens in front of the user's eyes. The host device is typically responsible for performing at least some processing of the multimedia data for display on the wearable display device. In the case of wireless devices, both of the host device and the wearable display device may be powered by limited battery resources. Improved battery life and battery life conservation are, therefore, of paramount concern when designing WCDs and wireless wearable display devices.

SUMMARY

In general, this disclosure relates to techniques for controlling operation of both a host device and a wearable display device connected to the host device based on a use status of the wearable display device. A wearable display device typically includes a manual on/off switch and, when switched on, the wearable display device may process data received from a host device for display on the wearable display device. Conventionally, the host device processes and sends data to the wearable display device, and the wearable display device processes and displays the received data regardless of whether the user is actually wearing the wearable display device for use viewing and interacting with the displayed data. In the case of wireless devices, the continuous processing is an unnecessary drain on the relatively short battery cycle-lives of both the wearable display device and the host device.

The techniques of this disclosure include automatically determining a use status of a wearable display device based on feedback from one or more touch sensors of the wearable display device that indicates whether the wearable display device is worn by a user. Based on the determined use status, the wearable display device controls its own operation. For example, the wearable display device may control operation of display screens of the wearable display device, a communication session with the host device, and display processing of data received from the host device. The wearable display device also sends an indication of the use status to the host device. The host device may then control its own data processing for the wearable display device based on the indicated use status of the wearable display device.

In one example, this disclosure is directed to a method of controlling a wearable display device connected to a host device, the method comprising determining, with the wearable display device, a use status of the wearable display device based on feedback from one or more touch sensors of the wearable display device that indicates whether the wearable display device is worn by a user, sending, with the wearable display device, an indication of the use status of the wearable display device to the host device to control data processing at the host device for the wearable display device, and controlling, with the wearable display device, operation of the wearable display device based on the use status of the wearable display device In another example, this disclosure is directed to a method of controlling a host device connected to a wearable display device, the method comprising receiving, with the host device, an indication of a use status of the wearable display device, wherein the use status of the wearable display device is determined based on feedback from one or more touch sensors of the wearable display device that indicates whether the wearable display device is worn by a user, and controlling, with the host device, data processing at the host device for the wearable display device based on the indicated use status of the wearable display device.

In a further example, this disclosure is directed to a wearable display device connected to a host device, the wearable display device comprising one or more touch sensors, and one or more processors configured to determine a use status of the wearable display device based on feedback from the touch sensors that indicates whether the wearable display device is worn by a user, send an indication of the use status of the wearable display device to the host device to control data processing for the wearable display device at the host device, and control operation of the wearable display device based on the use status of the wearable display device.

In another example, this disclosure is directed to a host device connected to a wearable display device, the host device comprising one or more processors configured to receiving an indication of a use status of the wearable display device, wherein the use status of the wearable display device is determined based on feedback from one or more touch sensors of the wearable display device that indicates whether the wearable display device is worn by a user, and control data processing for the wearable display device based on the indicated use status of the wearable display device.

In an additional example, this disclosure is directed to a wearable display device connected to a host device, the wearable display device comprising means for determining a use status of the wearable display device based on feedback from one or more touch sensors of the wearable display device that indicates whether the wearable display device is worn by a user, means for sending an indication of the use status of the wearable display device to the host device to control data processing for the wearable display device at the host device, and means for controlling operation of the wearable display device based on the use status of the wearable display device.

In a further example, this disclosure is directed to a host device connected to a wearable display device, the host device comprising means for receiving an indication of a use status of the wearable display device, wherein the use status of the wearable display device is determined based on feedback from one or more touch sensors of the wearable display device that indicates whether the wearable display device is worn by a user, and means for controlling data processing at the host device for the wearable display device based on the indicated use status of the wearable display device.

In another example, this disclosure is directed to a computer-readable medium comprising instructions for controlling a wearable display device connected to a host device, the instructions when executed cause one or more programmable processors to determine, with the wearable display device, a use status of the wearable display device based on feedback from one or more touch sensors of the wearable display device that indicates whether the wearable display device is worn by a user, send, with the wearable display device, an indication of the use status of the wearable display device to the host device to control data processing for the wearable display device at the host device, and control, with the wearable display device, operation of the wearable display device based on the use status of the wearable display device.

In a further example, this disclosure is directed to a computer-readable medium comprising instructions for controlling a host device connected to a wearable display device, the instructions when executed cause one or more programmable processors to receive, with the host device, an indication of a use status of the wearable display device, wherein the use status of the wearable display device is determined based on feedback from one or more touch sensors of the wearable display device that indicates whether the wearable display device is worn by a user, and control, with the host device, data processing for the wearable display device based on the indicated use status of the wearable display device.

The details of one or more examples of the disclosure are set forth in the accompanying drawings and the description below. Other features, objects, and advantages will be apparent from the description, drawings, and claims.

DETAILED DESCRIPTION

Figure 1:
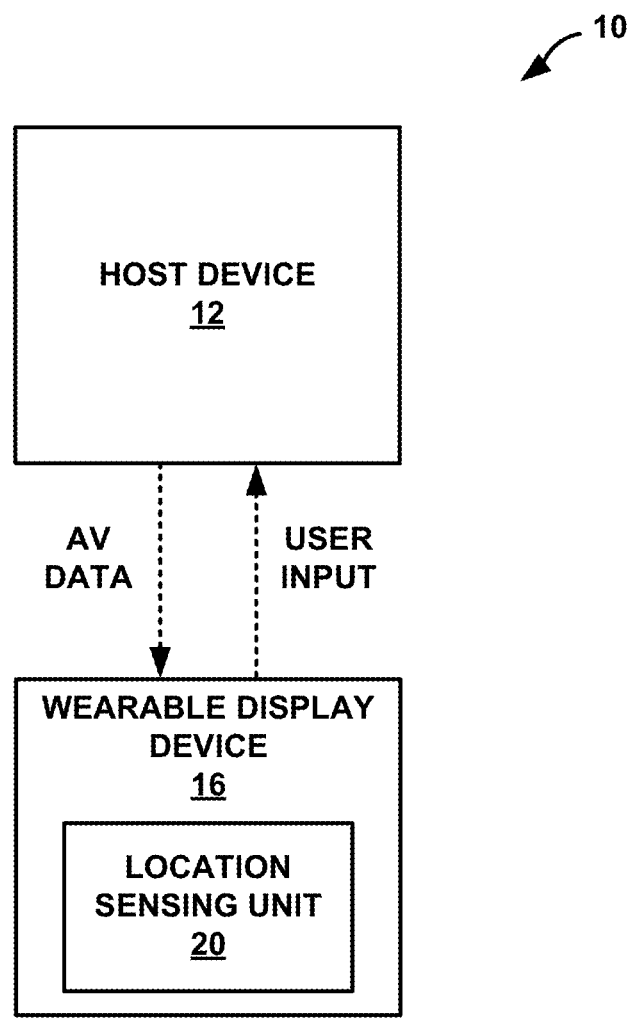
FIG. 1 is a block diagram illustrating a Wireless Display (WD) system including a host device and a wearable display device.

FIG. 1 is a block diagram illustrating a Wireless Display (WD) system 10 including a host device 12 and a wearable display device 16. In the example of FIG. 1, WD system 10 includes host device 12 and only one client device, i.e., wearable display device 16. In other examples, WD system 10 may include additional client devices (not shown), which may comprise wearable display devices, wireless devices or wired devices with wireless communication capabilities.

In some examples, WD system 10 may conform to the Wi-Fi Direct (WFD) standard defined by the Wi-Fi Alliance. The WFD standard enables device-to-device communication over Wi-Fi networks, i.e., wireless local area networks, in which the devices negotiate their roles as either access points or client devices. WD system 10 may include one or more base stations (not shown) that support a plurality of wireless networks over which a peer-to-peer (P2P) group communication session may be established between host device 12, wearable display device 16, and other participating client devices. A communication service provider or other entity may centrally operate and administer one or more of these wireless networks using a base station as a network hub.

According to the WFD standard, host device 12 may act as a wireless access point and receive a request from wearable display device 16 to establish a P2P group communication session. For example, host device 12 may establish the P2P group communication session between host device 12 and wearable display device 16 using the Real-Time Streaming Protocol (RTSP). The P2P group communication session may be established over a wireless network, such as a Wi-Fi network that uses a wireless communication standard, e.g., IEEE 802.11a, 802.11g, or 802.11n improvements to previous 802.11 standards. Additional information regarding wireless networks may be found in Gast, M., "802.11® Wireless Networks: The Definitive Guide," O'Reilly, April 2002.

Once the P2P group communication session is established, host device 12 may send multimedia data, which may include audio video (AV) data, audio data, and/or video data, to wearable display device 16, and any other client devices, participating in the particular P2P group communication session. For example, host device 12 may send the multimedia data to wearable display device 16 using the Real-time Transport protocol (RTP). The multimedia data may be played back at both a display of host device 12 and display screens of wearable display device 16. For example, wearable display device 16 may process the multimedia data received from host device 12 for presentation on its display screens and audio equipment. In addition, host device 12 may perform at least some processing of the multimedia data for presentation on wearable display device 16.

A user of wearable display device 16 may provide user input via an interface, such as a human interface device (HID), included within or connected to wearable display device 16. An HID may comprise one or more of a touch display, an input device sensitive to an input object (e.g., a finger, stylus, etc.), a keyboard, a tracking ball, a mouse, a joystick, a remote control, a microphone, or the like. Wearable display device 16 sends the provided user input to host device 12. In some examples, wearable display device 16 sends the user input over a reverse channel architecture referred to as a user input back channel (UIBC). In this way, host device 12 may respond to the user input provided at wearable display device 16. For example, host device 12 may process the received user input and apply any effect of the user input on subsequent data sent to wearable display device 16.

Host device 12 may be either a wireless device or a wired device with wireless communication capabilities. In one example, as a wired device, host device 12 may comprise one of a television, monitor, projector, set-top box, DVD or Blu-Ray Disc player, digital video recorder, laptop or desktop personal computer, video game console, and the like, that includes wireless communication capabilities. In another example, as a wireless device, host device 12 may comprise one of a mobile telephone, portable computer with a wireless communication card, personal digital assistant (PDA), portable media player, or other flash memory device with wireless communication capabilities, including a so-called "smart" phone and "smart" pad or tablet, or another type of wireless communication device (WCD).

Wearable display device 16 may comprise any type of wired or wireless display device that is worn on a user's body. As an example, wearable display device 16 may comprise a head-worn display or a head-mounted display (HMD) that is worn on a user's head in order to position one or more display screens in front of the user's eyes. In general, the display screens of wearable display device 16 may comprise one of a variety of display screens such as a liquid crystal display (LCD), a plasma display, an organic light emitting diode (OLED) display, or another type of display screen.

In one example, wearable display device 16 may comprise a HMD device formed as glasses that include display screens in one or more of the eye lenses, and also include a nose bridge and temple arms to be worn on a user's face. As another example, wearable display device 16 may comprise a HMD device formed as goggles that includes display screens in separate eye lenses or a single display screen, and that also includes at least one strap to hold the goggles on the user's head. Although wearable display device 16 is primarily described in this disclosure as being a HMD, in other examples wearable display device 16 may comprise display devices that are worn on other portions of the user's body, such as on the user's neck, shoulders, arm or wrist. Specific examples of HMDs and their operation are described in more detail in Rolland, J. & Hua, H., "Head-Mounted Display Systems," Encyclopedia of Optical Engineering, 2005.

In WD system 10, host device 12 and wearable display device 16 are typically wireless devices. For example, wearable display device 16 may comprise a wireless HMD (WHMD) that connects wirelessly to host device 12, and host device 12 may comprise a WCD, such as a mobile smart phone or smart pad. In this example, in addition to typical WCD operations, host device 12 performs at least some multimedia data processing for presentation on wearable display device 16 and user input processing from user interface interactivity at wearable display device 16. Host device 12 may perform these operations with a power manager sourced by a rechargeable battery that is limited by size and weight in order to fit within the structure of a handheld device.

The power manager and battery for wearable display device 16 may be even further limited because wearable display device 16 is intended to be worn on the user's body. Since wearable display device 16 may be a HMD worn on the user's head, the structure of wearable display device 16 needs to be small and lightweight enough to remain comfortable during use. These size and weight restrictions may result in relatively small batteries being included in wearable display device 16 compared to other mobile devices. Wearable display device 16, therefore, may need to perform multimedia data processing for presentation and user interface interactivity with a power manager sourced by a rechargeable battery that is limited by size, weight, balance, thermal, and health constraints.

The WFD standard does provide some power management protocols for devices, such as host device 12, that operate as access points, namely the Opportunistic Power Save protocol and the Notice of Absence protocol. Both of these power management protocols enable a device operating as an access point to save power by going to sleep during either convenient or pre-planned periods, without dismantling a P2P group communication session with the one or more client devices. More information regarding these WFD power management protocols is available in Camps-Mur, D., et al., "Designing Energy Efficient Access Points with Wi-Fi Direct," The International Journal of Computer and Telecommunications Networking, Vol. 55, Issue 13, September 2011.

Wearable display device 16 may include a manual on/off switch (not shown) and, when switched on, wearable display device 16 processes data received from host device 12 for display on wearable display device 16. Merely turning on wearable display device 16, however, does not indicate whether a user is actually wearing wearable display device 16 for use viewing and interacting with the displayed data. Conventionally, a host device will process and send data to a wearable display device, and the wearable display device will process and display the received data regardless of whether the user is actually wearing the wearable display device. In the case of wireless devices, the continuous processing is an unnecessary drain on the short battery cycle-life of both the wearable display device and the host device.

Wearable display device 16 necessarily requires a user to wear the device for use, so the operation of wearable display device 16 and the related multimedia data processing at host device 12 is only needed when the user is actually wearing the device. Because the user has to wear wearable display device 16, the use of wearable display device 16 may be intrusive and interfere with the user's normal activities. The use of wearable display device 16, therefore, may be arbitrarily interrupted, and it is unlikely that the user will remember to manually turn off wearable display device 16.

In general, this disclosure relates to techniques for controlling operation of both host device 12 and wearable display device 16 connected to host device 12 based on a use status, i.e., whether in use or not in use, of wearable display device 16. According to the techniques, the use status of wearable display device 16 is automatically detected to minimize unnecessary processing and conserve battery cycle-life at both host device 12 and wearable display device 16 without relying on user interaction. As illustrated in FIG. 1, wearable display device 16 includes a location sensing unit 20 configured to automatically determine whether wearable display device 16 is worn by a user for use viewing and/or interacting with the displayed data.

The techniques of this disclosure include the use of wearable display device 16 including one or more touch sensors (not shown in FIG. 1) positioned at locations that are in contact or close proximity with the user when the user is wearing wearable display device 16. In an example where wearable display device 16 comprises a WHMD device formed as glasses, wearable display device 16 may include at least one sensor on a nose bridge and at least two sensors on temple arms that will be in contact with the user's nose and ears, respectively, when the glasses are worn. In this way, the touch sensors will be unavoidably in contact with the user when the user is wearing and using the wearable display device. In other examples, wearable display device 16 may include more or fewer touch sensors positioned at different locations depending on the form or shape of the device. In addition, in some cases, wearable display device 16 may include touch sensors capable of being triggered by close proximity to the user's body without requiring actual contact with the user's body.

According to the techniques, location sensing unit 20 automatically determines a use status of wearable display device 16 based on feedback from the touch sensors of wearable display device 16. The feedback indicates to location sensing unit 20 whether wearable display device 16 is being worn by the user. Based on the determined use status, wearable display device 16 controls its own operation. For example, wearable display device 16 may control operation of one or more of display screens of wearable display device 16, the communication session with host device 12, and display processing of data received from host device 12. Wearable display device 16 also sends an indication of the use status to host device 12. Host device 12 may then control its own data processing for wearable display device 16 based on the indicated use status of wearable display device 16.

Figure 2:
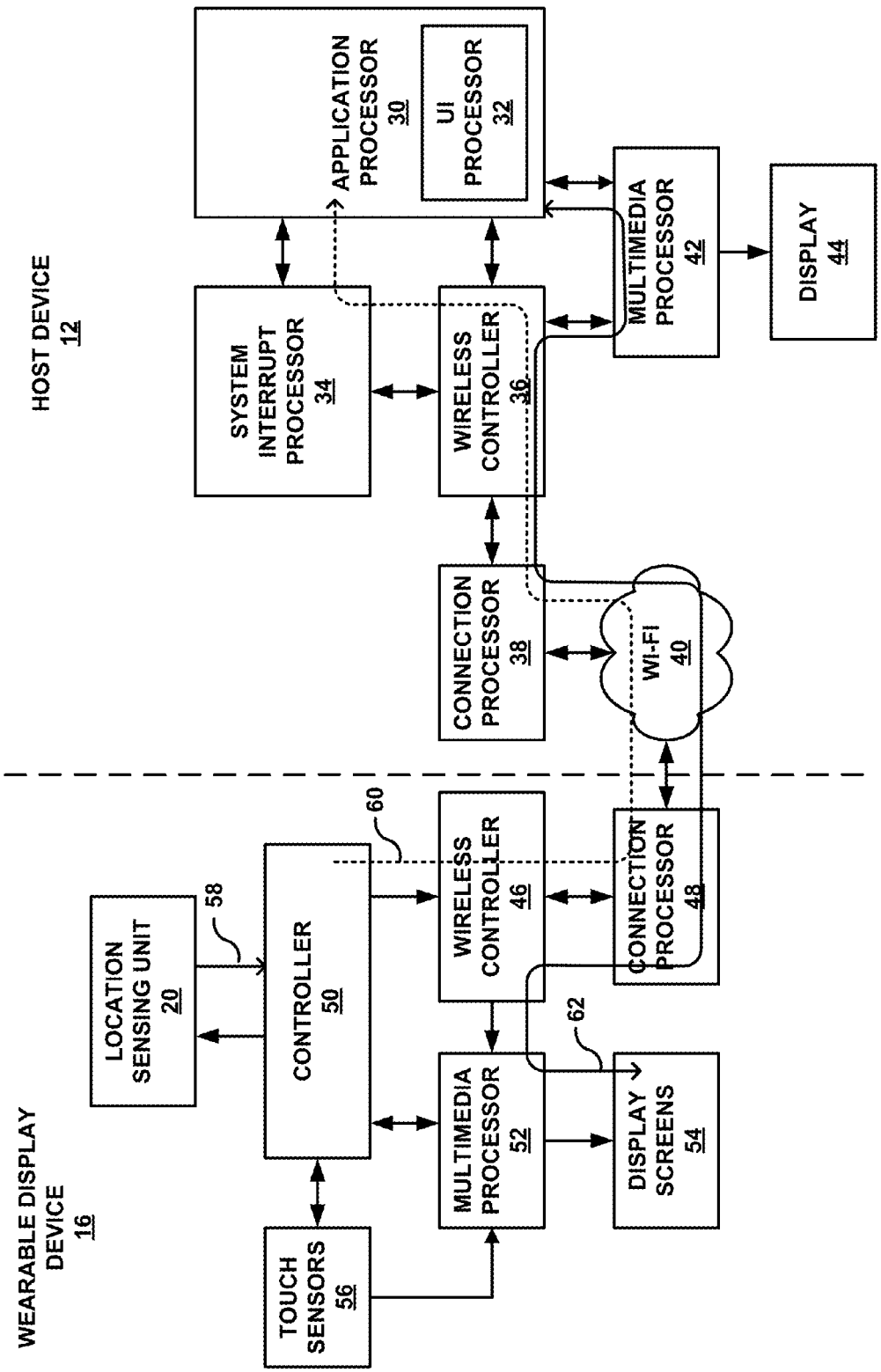
FIG. 2 is a block diagram illustrating the host device and wearable display device from FIG. 1 in greater detail.

FIG. 2 is a block diagram illustrating host device 12 and wearable display device 16 from FIG. 1 in greater detail. For purposes of this disclosure, host device 12 and wearable display device 16 will primarily be described as being wireless devices with limitations on battery size and weight, resulting in short battery cycle-life. For example, host device 12 may comprise a smart phone or smart pad, or other handheld WCD, and wearable display device 16 may comprise a WHMD device. In other examples, however, host device 12 and wearable display device 16 may comprise either wireless devices or wired devices with wireless communication capabilities.

In the example illustrated in FIG. 2, host device 12 includes an application processor 30, a system interrupt processor 34, a wireless controller 36, a connection processor 38, a multimedia processor 42 and a display 44. Application processor 30 includes a user input (UI) processor 32. In other examples, host device 12 may comprise additional functional units or modules used to control and perform WCD operations. As an example, a more detailed version of host device 12 is described below with respect to FIG. 7.

As illustrated in FIG. 2, wearable display device 16 includes location sensing unit 20, wireless controller 46, connection processor 48, controller 50, multimedia processor 52, display screens 54 and touch sensors 56. Controller 50 comprises a main controller for wearable display device 16, and controls the overall operation of wearable display device 16. Location sensing unit 20 and touch sensors 56 of wearable display device 16 and their operation in accordance with the techniques of this disclosure are described in more detail below and with respect to FIGS. 3-6.

In general, host device 12 processes multimedia data for presentation on its own display 44, and may also process multimedia data for presentation on wearable display device 16. In addition, wearable display device 16 may receive user input via an interface, such as a HID, and may send the user input to host device 12 for processing. In FIG. 2, the transfer of both multimedia data and user input between host device 12 and wearable display device 16 is illustrated as a path 62.

To transfer multimedia data from host device 12 to wearable display device 16, path 62 may begin at application processor 30. Application processor 30 provides an environment in which a variety of applications may run on host device 12. Example applications include texting applications, email applications, video or picture slideshow applications, presentation applications, video conferencing applications, and the like. Application processor 30 may receive data for use by these applications from internal or external storage location and/or internal or external sensors or cameras associated with host device 12. The applications running on application processor 30, in turn, generate multimedia data for presentation to a user of host device 12 and/or wearable display device 16. In other examples, path 62 may begin at multimedia processor 42 or some other functional device that either generates multimedia data or receives multimedia data directly from the storage locations and/or sensors or cameras.

Multimedia processor 42 may display process the received multimedia data for presentation on display 44 of host device 12. In addition, multimedia processor 42 may process the received multimedia data for transmission and presentation on wearable display device 16. In the latter case, wireless controller 36 packages the processed data for transmission. Packaging the processed data may include grouping the data into packets, frames or cells that may depend on the wireless communication standard used over Wi-Fi network 40. Connection processor 38 then transmits the processed data to wearable display device 16 using Wi-Fi network 40. Connection processor 38 manages the connections of host device 12, including a P2P group communication session with wearable display device 16 over Wi-Fi network 40, and the transmission and receipt of data over the connections.

The transfer of the multimedia data continues along path 62 at wearable display device 16 when connection processor 48 receives the transmitted data from host device 12. Similar to connection processor 38 of host device 12, connection processor 48 of wearable display device 16 manages the connections of wearable display device 16, including a P2P group communication session with host device 12 over Wi-Fi network 40, and the transmission and receipt of data over the connections. Wireless controller 46 unpackages the received data for processing by multimedia processor 52. Multimedia processor 52 then display processes the received data for presentation on display screens 54 of wearable display device 16.

To transfer user input from wearable display device 16 to host device 12, path 62 may be followed, in reverse from that described above, beginning at multimedia processor 52. Multimedia processor 52 may receive user input via a HID or other user interface (not shown) included within or connected to wearable display device 16. Wireless controller 46 packages the user input, and connection processor 48 transmits the packaged user input over Wi-Fi network 40 to host device 12. At host device 12, connection processor 38 receives the transmitted user input, and wireless controller 36 unpackages the received user input for processing by multimedia processor 42 and UI processor 32. In this way, host device 12 may respond to the user input by applying any effect of the user input on data processing at multimedia processor 42 and/or the applications running on application processor 30.

Conventionally, host device 12 and wearable display device 16 would continue operating as described above until some user interaction occurred to disconnect, put to sleep, or power off wearable display device 16. Continuously processing data for display on wearable display device 16 regardless of whether the user is wearing wearable display device 16, however, consumes substantial power resources of both host device 12 and wearable display device 16. To conserve battery-cycle life, the techniques of this disclosure include location sensing unit 20 and touch sensors 56 in wearable display device 16 in order to enable an automatic determination of a use status of wearable display device 16, i.e., whether wearable display device 16 is worn by a user for use viewing and/or interacting with the displayed data. In addition, the techniques include notifying host device 12 of the use status of wearable display device 16. In this way, the techniques enable wearable display device 16 to automatically enter a reduced power state, in which all components except location sensing unit 20 are shut down, without relying on user interaction to disconnect, put to sleep, or power off wearable display device 16. The techniques also allow host device 12 to disable data processing at host device 12 for wearable display device 16 when wearable display device 16 is not in use.

Location sensing unit 20 of wearable display device 16 is designed to always be operating even when the remaining components of wearable display device 16 are asleep or powered down. In some cases, a portion of controller 50 responsible for the operation of location sensing unit 20 may also remain powered on. In order to remain "always on," location sensing unit 20 is designed to consume ultra-low power, e.g., approximately 10 microwatts (μW). In addition, location sensing unit 20 may require negligible additional hardware at wearable display device 16. Location sensing unit 20 may also avoid engaging user input controls that would unnecessarily engage host device 12 and may be used for some application specific UI controls at wearable display device 16 to minimize latency.

Location sensing unit 20 receives feedback from touch sensors 56 that indicates whether wearable display device 16 is worn by a user. Based on the feedback, location sensing unit 20 continuously determines the use status of wearable display device 16. As described in more detail below, in some cases, location sensing unit 20 may generate an oscillation frequency that changes based on whether touch sensors 56 are in contact with the user's body, and determine the use status of wearable display device 16 based on a comparison of the generated oscillation frequency and a threshold frequency value.

Touch sensors 56 may be positioned within wearable display device 16 at locations that will be in contact or close proximity with the user when the user is wearing wearable display device 16. An example in which wearable display device 16 comprises a WHMD device formed as glasses is described in more detail with respect to FIG. 3. In some cases, each of touch sensors 56 may comprise a capacitance touch sensor that increases an oscillation frequency generated by location sensing unit 20. In this example, when the oscillation frequency generated by location sensing unit 20 is greater than a threshold frequency value, location sensing unit 20 determines that wearable display device 16 is in use.

When a change in the use status occurs, e.g., a user puts on or takes off the wearable display device 16, location sensing unit 20 may inform controller 50 of the determined use status via a direct processor interrupt request 58. In other examples, location sensing unit 20 may continuously send use status indications to controller 50 regardless of whether a change in use status has occurred. Controller 50, in turn, may generate a virtual processor interrupt request 60 to indicate the use status of wearable display device 16 to host device 12. As illustrated in FIG. 2, virtual processor interrupt request 60 is packaged by wireless controller 46 and transmitted by connection processor 48 over Wi-Fi network 40 to host device 12. At host device 12, connection processor 38 receives the transmitted virtual processor interrupt request 60, and wireless controller 36 unpackages the received user input for processing by system interrupt processor 34 and application processor 30.

In the case where wearable display device 16 is in the reduced power state and a user puts on wearable display device for use, location sensing unit 20 receives feedback from touch sensors 56 indicating that wearable display device 16 is being worn by the user. Based on the feedback, location sensing unit 20 determines that wearable display device 16 is in use, and indicates the determined use to controller 50. For example, location sensing unit 20 may send direct processor interrupt request 58 to controller 50 to wake-up or activate the other components of wearable display device 16. Controller 50 controls operation of wearable display device 16 based on the indication of the use status of wearable display device 16. For example, controller 50 may instruct connection processor 48 to establish a communication session with host device 12. In addition, controller 50 may enable display processing at multimedia processor 52 of data received from host device 12, and activate display screens 54 of wearable display device 16 in order to display the processed data.

Upon receiving the indication from location sensing unit 20 that wearable display device 16 is in use, controller 50 also sends an indication that wearable display device is in use to host device 12. For example, controller 50 may send virtual processor interrupt request 60 to host device 12. Application processor 30 of host device 12 controls data processing at host device 12 for wearable display device 16 based on the indication of the use status of wearable display device 16. For example, application processor 30 may enable data processing at multimedia processor 42 for transmission and display on wearable display device 16. In some cases, application processor 30 may also instruct connection processor 38 to establish the communication session with wearable display device 16, and transmit the processed data to wearable display device 16 based on the indication that wearable display device 16 is in use. In addition, application processor 30 may enable UI processor 32 to process any user input received from wearable display device 16, and adjust the application processing and data processing based on the received use input.

In the case where wearable display device 16 is in use and a user removes the wearable display device, location sensing unit 20 receives feedback from touch sensors 56 indicating that wearable display device 16 is not worn by the user. Based on the feedback, location sensing unit 20 determines that wearable display device 16 is no longer in use, and indicates the determined use to controller 50. For example, location sensing unit 20 may send direct processor interrupt request 58 to controller 50 to put to sleep, shut-down, or otherwise deactivate the other components of wearable display device 16. Controller 50 controls operation of wearable display device 16 based on the indication of the use status of wearable display device 16. For example, controller 50 may disable display processing at multimedia processor 52 of data received from host device 12, and deactivate display screens 54 of wearable display device 16. Controller 50 may also instruct connection processor 48 to dismantle the communication session with host device 12.

Upon receiving the indication from location sensing unit 20 that wearable display device 16 is not in use, controller 50 also sends an indication that wearable display device is not in use to host device 12. For example, controller 50 may send virtual processor interrupt request 60 to host device 12. Application processor 30 of host device 12 controls data processing at host device 12 for wearable display device 16 based on the indication of the use status of wearable display device 16. For example, application processor 30 may disable data processing at multimedia processor 42 for transmission and display on wearable display device 16. In some cases, application processor 30 may also instruct connection processor 38 to dismantle the communication session with wearable display device 16, and cease transmission of data to wearable display device 16 based on the indication that wearable display device 16 is in use. In addition, application processor 30 may disable UI processor 32 from processing any user input received from wearable display device 16. In this way, the techniques of this disclosure may improve battery cycle-life and may reduce unnecessary data processing at both wearable display device 16 and host device 12.

Figure 3:
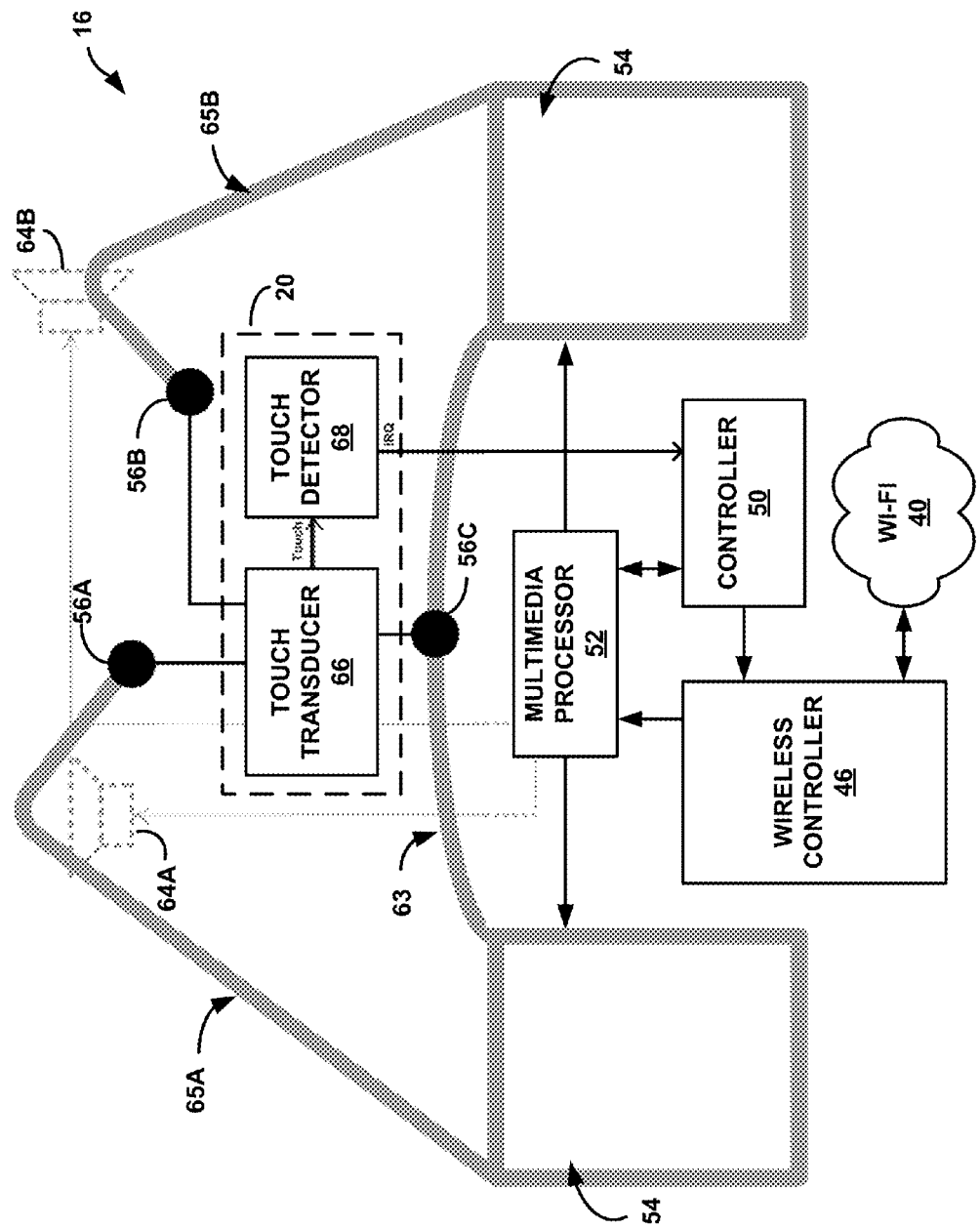
FIG. 3 is a block diagram illustrating an example of a wearable display device as a head-mounted display (HMD) formed as glasses with touch sensors.

FIG. 3 is a block diagram illustrating an example of wearable display device 16 as a HMD formed as glasses with touch sensors 56A-56C ("touch sensors 56"). As illustrated in FIG. 2 described above, wearable display device 16 includes wireless controller 46 that prepares data for transmission using the P2P group communication session with host device 12 established over Wi-Fi network 40, controller 50 that controls operation of wearable display device 16, and multimedia processor 52 that performs display processing of data received from host device 12. In the illustrated example, the lenses of the glasses comprise display screens 54 for which multimedia processor 52 processes video data for presentation to the user. In addition, wearable display device 16 includes speakers 64A and 64B ("speakers 64") for which multimedia processor 52 processes audio data for presentation to the user.

As illustrated in FIG. 3, wearable display device 16, formed as glasses, includes display screens 54 in the eye lenses held together by a nose bridge 63, and temple arms 65A and 65B ("temple arms 65") that enable wearable display device 16 to be worn on a user's face. In this example, touch sensors 56 are positioned at locations that will be unavoidably in contact with the user's body when the user is wearing wearable display device 16. In the illustrated example, wearable display device 16 includes a touch sensor 56C positioned on the nose bridge of the glasses, and touch sensors 56A and 56B positioned on the temple arms of the glasses that will be in contact with the user's nose and ears, respectively, when the glasses are worn. In other cases, wearable display device 16 may include touch sensors capable of being triggered by close proximity to the user's body without requiring actual contact with the user's body. In this case, the touch sensors may be positioned at locations on wearable display device 16 that will at least be in close proximity to the user's body, but not physically touching the user's body.

Location sensing unit 20 of wearable display device 16 includes a touch transducer 66 and a touch detector 68. Touch transducer 66 is directly connected to each of touch sensors 56 to receive the feedback from touch sensors 56. Touch transducer 66 converts the "touch" feedback from touch sensors 56 into electrical feedback. In cases where location sensing unit 20 generates an oscillation frequency to determine the use status of wearable display device 16, touch transducer 66 may convert the feedback from touch sensors 56 into additional capacitance that causes the generated oscillation frequency to increase when touch sensors 56 are in contact with the user's body.

Touch detector 68 receives the converted feedback from touch transducer 66 that indicates whether one or more of touch sensors 56 are in contact with the user's body, and determines whether wearable display device 16 is in use based on the feedback. More specifically, touch detector 68 may compare the oscillation frequency generated based on the feedback from touch sensors 56 with a threshold frequency value. For example, when the generated oscillation frequency is greater than the threshold frequency value, touch detector 68 may determine that wearable display device 16 is being worn by the user for use. Touch detector 68 may then send a direct processor interrupt request to controller 50 to indicate the determined use status of wearable display device 16.

In the illustrated example, wearable display device 16 includes three touch sensors 56. In other examples, wearable display device 16 may include more or fewer touch sensors. In some cases, it may be advantages to use two or more of touch sensors 56 so that location sensing unit 20 is capable of detecting whether all touch sensors 56 are in contact or close proximity with the user and wearable display device 16 is being properly worn for use, or whether less than all of touch sensors 56 are in contact with the user and wearable display device 16 is incorrectly positioned or being held at one or more of touch sensors 56. For example, location sensing unit 20 will generate the highest oscillation frequency when all of touch sensors 56 are simultaneously in contact with a surface of the user's body, indicating that the user is wearing wearable display device 16 for use. The threshold frequency value may be a preset value that requires all of touch sensors 56 to be in contact with the user. In other examples, the threshold frequency value may be a preset value that requires at least one of touch sensors 56 to be in contact with the user.

As described above, location sensing unit 20 may be designed to be "always on." Touch transducer 66 may, therefore, continually receive feedback from touch sensors 56 and convert the feedback for location sensing unit 20 to generate a constantly updating oscillation frequency. In addition, touch detector 68 may continually compare the updated oscillation frequency with the threshold frequency value to determine a current use status of wearable display device 16.

In some cases, touch detector 68 sends a direct processor interrupt request to controller 50 to indicate the use status only when a change occurs in the determined use status of wearable display device 16. In this way, controller 50 is only notified of the use status when a wake-up or shut-down operation needs to be performed. In other cases, touch detector 68 continually sends an indication of the use status to controller 50, and controller 50 then detects when a change in the use status has occurred to control operation of wearable display device 16, and sends an indication of the use status change to host device 12. In either case, the use status determination, and subsequent wake-up or shut-down operation may be performed as background processes of wearable display device 16.

In the illustrated example, wearable display device 16 is a HMD formed as glasses. In other examples, wearable display device 16 may comprise any type of wired or wireless display device that is worn on a user's body, including HMDs with a different form factor than shown in FIG. 3. As an example, wearable display device 16 may comprise a HMD device formed as goggles that includes display screens in separate eye lenses or a single display screen, and that also includes at least one strap to hold the goggles on the user's head. As some examples, wearable display device 16 may comprise a display device that is worn on other portions of the user's body, such as on the user's neck or shoulders.

Figure 4:
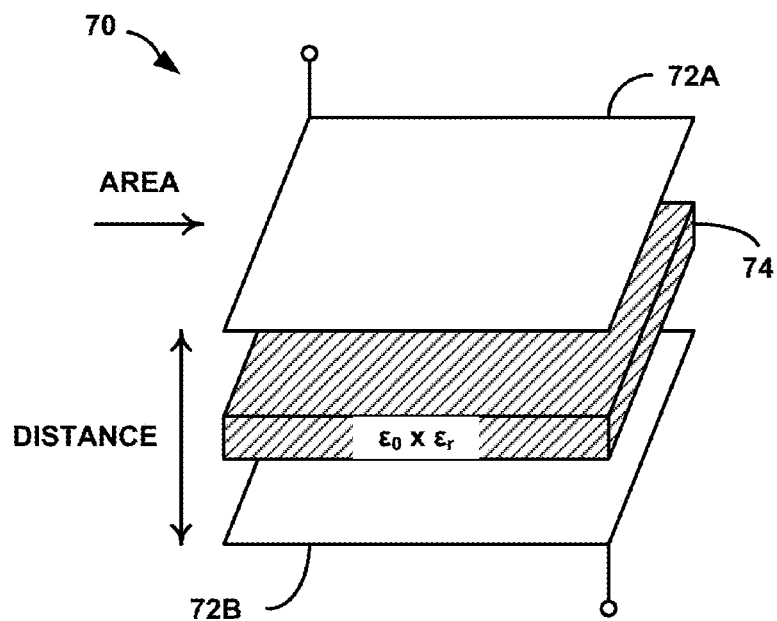
FIG. 4 is conceptual diagram illustrating an example parallel-plate capacitor.

FIG. 4 is conceptual diagram illustrating an example parallel-plate capacitor 70. According to the techniques of this disclosure, parallel-plate capacitor 70 may be associated with one of touch sensors 56 included in wearable display device 16 from FIG. 3. Capacitor 70 includes a top plate 72A and a bottom plate 72B ("plates 72") positioned parallel to each other, and a dielectric material 74 sandwiched between plates 72A and 72B. In FIG. 4, dielectric material 74 is indicated as having an actual permittivity equal to the product of the relative permittivity, $\in_r$, of dielectric material 74 and the permittivity of free space, $\in_o$. The permittivity of dielectric material 74 indicates the ability of dielectric material 74 to transmit an electric field.

In general, the capacitance of parallel-plate capacitor 70 indicates the ability of capacitor 70 to store an electric charge. The capacitance of parallel-plate capacitor 70 is dependent on the area of plates 72, the distance between plates 72, and the relative permittivity or dielectric constant of dielectric material 74 between plates 72. Specifically, the capacitance of parallel-plate capacitor 70 is equal to $C=\in_0*\in_r*(A/d)$, where A represents the area of plates 72 and d represents the distance between plates 72.

Figure 5:
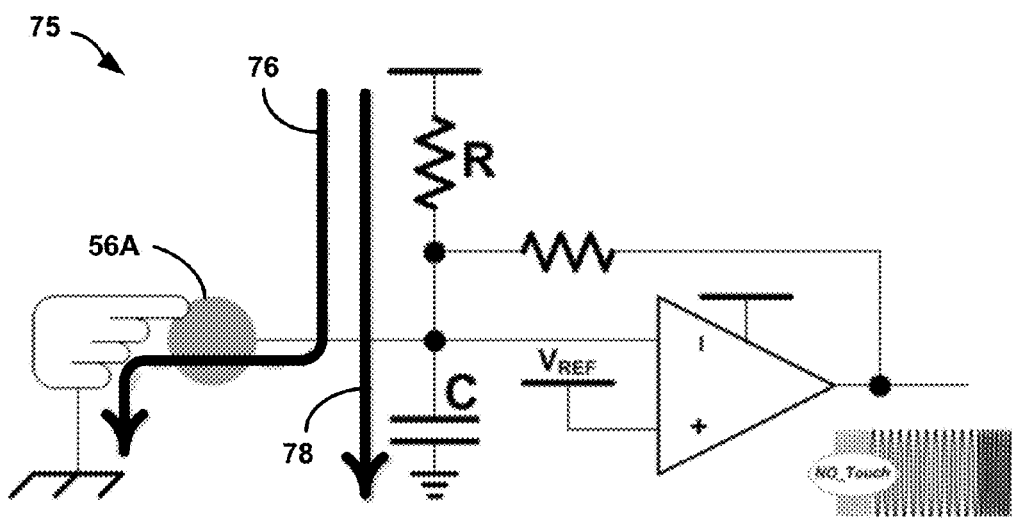
FIG. 5 is a circuit diagram illustrating an example RC-oscillator circuit including a touch sensor within the wearable display device from FIG. 3.

FIG. 5 is a circuit diagram illustrating an example RC-oscillator circuit 75 including touch sensor 56A within wearable display device 16 from FIG. 3. In some examples, RC-oscillator circuit 75 may be considered a relaxation oscillator. RC-oscillator circuit 75 includes an amplifier that generates an oscillation frequency based on frequency selective input provided by an RC network, which includes at least one resistor (R) and at least one capacitor (C).

In the example illustrated in FIG. 5, RC-oscillator circuit 75 also includes touch sensor 56A of wearable display device 16 from FIG. 3. Touch sensor 56A may comprise a capacitance touch sensor that includes a plate or electrode that is positioned within wearable display device 16 such that touch sensor 56A will be in contact with the user when wearable display device 16 is worn. When touch sensor 56A is in contact with the user's body, a capacitor is created in which the user's skin acts as a dielectric material and the Earth acts as a ground for the electrode of touch sensor 56A.

In one example illustrated in FIG. 5, when touch sensor 56A is not in contact with a surface of the user's body, current 78 does not flow to touch sensor 56A and the generated oscillation frequency depends only on R and C. This oscillation frequency may be considered the baseline or default oscillation frequency of RC-oscillator circuit 75. In another example illustrated in FIG. 5, when touch sensor 56A is in contact with the user's body, current 76 flows to touch sensor 56A and through the user's body to ground. In this case, the capacitance of the user's body, e.g., $C_{touch}$, is added to the RC network. The additional capacitance changes the overall RC time-constant of the RC network and alters the generated oscillation frequency. The techniques of this disclosure use the altered oscillation frequency value to determine whether wearable display device 16 is worn by the user.

Figure 6:
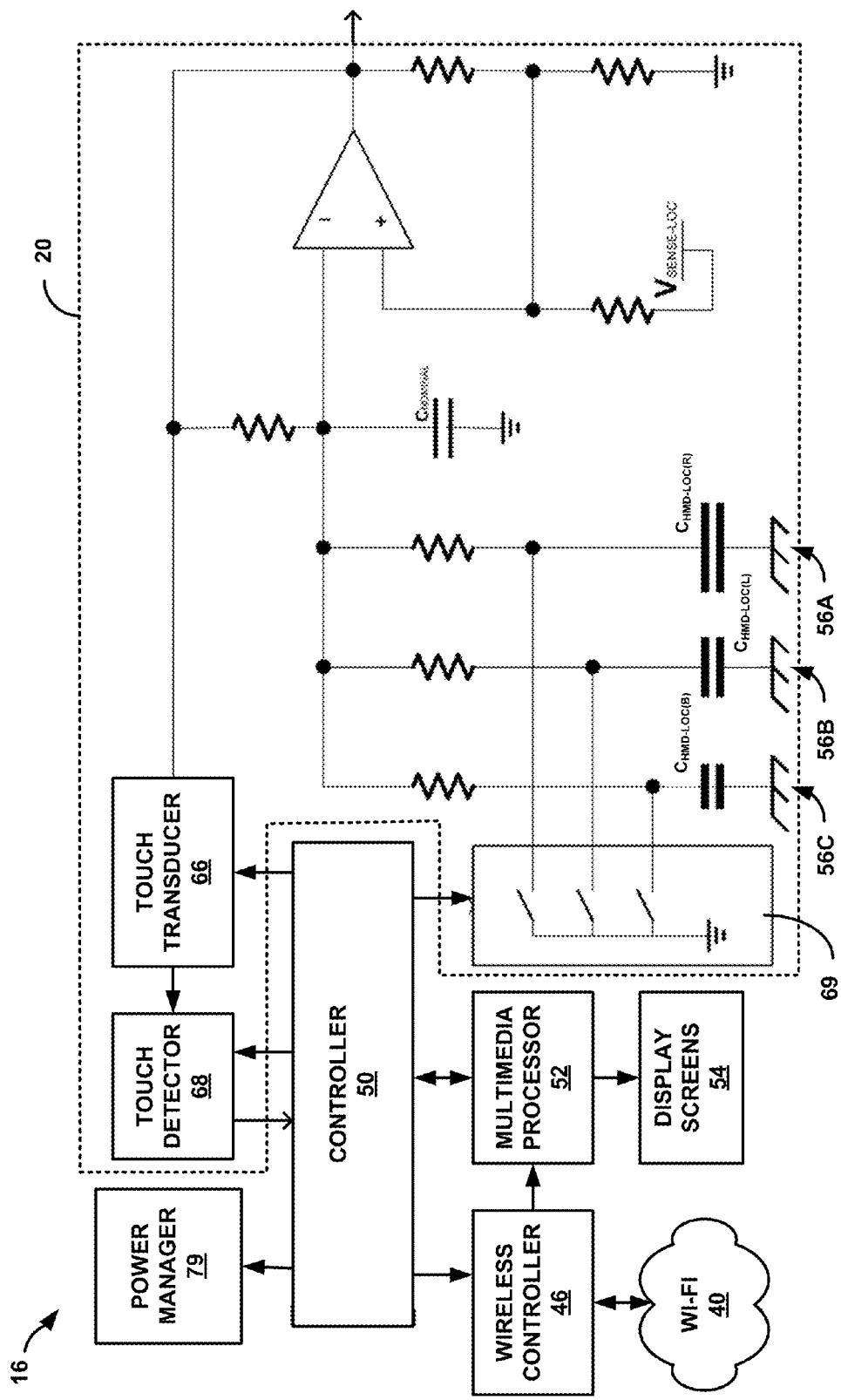
FIG. 6 is a block diagram illustrating a location sensing unit included in the wearable display device from FIG. 2 in greater detail.

FIG. 6 is a block diagram illustrating location sensing unit 20 included in wearable display device 16 from FIG. 2 in greater detail. As illustrated in FIG. 2 described above, wearable display device 16 includes wireless controller 46 that prepares data for transmission using the P2P group communication session with host device 12 established over Wi-Fi network 40, controller 50 that controls operation of wearable display device 16, and multimedia processor 52 that performs display processing of data received from host device 12 for presentation on display screens 54. Furthermore, as illustrated in FIG. 3 described above, location sensing unit 20 of wearable display device 16 includes touch transducer 66 that receives feedback from touch sensors 56 and touch detector 68 that determines a use status of wearable display device based on the feedback converted by touch transducer 66.

In the illustrated example of FIG. 6, location sensing unit 20 further includes an RC oscillation circuit that generates an oscillation frequency based on the feedback from touch sensors 56. The RC-oscillator circuit may operate substantially similar to RC-oscillator circuit 75 from FIG. 5 with the inclusion of additional capacitance touch sensors. Touch sensors 56 are illustrated in FIG. 6 as additional capacitors included in the RC-oscillator circuit of location sensing unit 20 that are connected to an earth ground through a user's body. Each of touch sensors 56 may operate substantially similar to touch sensor 56A described with respect to FIG. 5.

When wearable display device 16 is first powered on, location sensing unit 20 activates a grounding circuit 69 to ground all of touch sensors 56 for a preset period of time. During that period, the RC-oscillator circuit generates a default oscillation frequency for wearable display device 16 when touch sensors 56 are not in contact with the user's body. Once the default oscillation frequency is determined, location sensing unit 20 may begin the use status determination operation.

Touch transducer 66 receives feedback from touch sensors 56 during a scan timer period and the RC-oscillator circuit generates an oscillation frequency based on the feedback. The scan timer period may be a preset period of time during which the RC-oscillator circuit of location sensing unit 20 generates the oscillation frequency based on feedback from touch sensors 56. The scan timer period may allow the resulting oscillation frequency to stabilize before touch detector 68 compares the oscillation frequency to a threshold frequency value to determine a use status of wearable display device 16.

When one or more of touch sensors 56 are in contact with the user's body, touch transducer 66 receives feedback as a faster capacitance discharge rate through the additional capacitors. This feedback from touch sensors 56 results in the RC-oscillator circuit generating a higher oscillation frequency than when touch sensors 56 are not touched. Touch detector 68 then compares the higher oscillation frequency to the threshold frequency value to determine whether the frequency is high enough to indicate that the user is wearing wearable display device 16 for use.

For example, the threshold frequency value may be a preset value that is less than the highest oscillation frequency, but greater than an oscillation frequency generated when none of touch sensors 56 are in contact with the user's body. In some cases, the threshold frequency value may be preset such that touch detector 68 only determines that wearable display device 16 is in use when all of touch sensors 56 are in contact with the user. In other cases, the threshold frequency value may be preset such that touch detector 68 determines that wearable display device 16 is in use when at least one of touch sensors 56 is in contact with the user.

As illustrated in FIG. 6, wearable display device 16 also includes a power manager 79 that may store battery status information that reflects whether wearable display device 16 is wall plugged or using its battery reserve, and if using the battery reserve, the level of remaining battery power. In some cases, the battery status information may be displayed to the user of wearable display device 16, e.g., using a small battery icon, lights or sounds to indicate different battery conditions. Power manager 79 may update the battery status information almost continuously to reflect an accurate battery status to the user of wearable display device 16. In some cases, when the battery reserve is below a minimum value, power manager 79 may initiate a shut-down or sleep operation for wearable display device 16 regardless of its use status.

Figure 7:
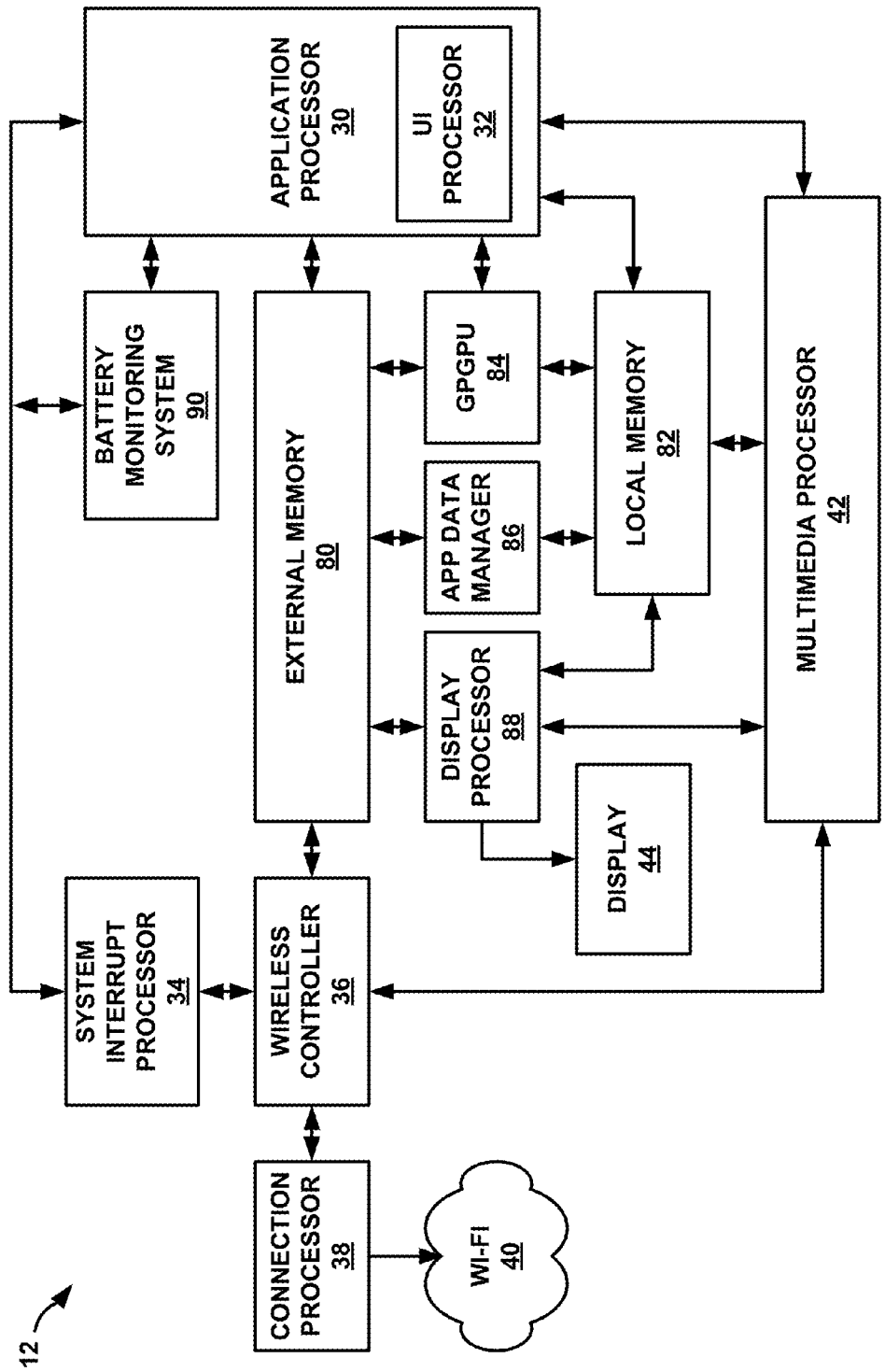
FIG. 7 is a block diagram illustrating the host device from FIG. 2 in greater detail.

FIG. 7 is a block diagram illustrating host device 12 from FIG. 2 in greater detail. In the illustrated example, host device 12 includes application processor 30 with UI processor 32, system interrupt processor 34, wireless controller 36, connection processor 38, multimedia processor 42, display 44, external memory 80, local memory 82, general purpose graphics processing unit (GPGPU) 84, application data manager 86, display processor 88, battery monitoring system 90 and security manager 92.

In general, application processor 30, UI processor 32, system interrupt processor 34, wireless controller 36, connection processor 38, multimedia processor 42 operate as described above with respect to FIG. 2. Applications running on application processor 30 generate multimedia data, e.g., AV data, video data, or audio data, for presentation to a user of host device 12 and/or wearable display device 16 or some other client device connected to host device 12. In some cases, multimedia processor 42 may process the same video data for display on both display 44 and an external display of wearable display device 16 or another client device. In other cases, multimedia processor 42 may process video data for display on only one of display 44 and an external display.

To present the data on host device 12, multimedia processor 42 may perform some pre-processing, and display processor 88 performs display processing of the video data for presentation on display 44. In the case of audio data, multimedia processor 42 may again perform some pre-preprocessing, and an audio processor (not shown) may perform further audio processing for presentation on one or more speakers (not shown) of host device 12. To present the data on wearable display device 16 or some other client device connected to host device 12, multimedia processor 42 may perform some pre-processing, and wireless controller 36 and connection processor 38 then respectively package and transmit the processed data to the client device via Wi-Fi network 40. Connection processor 38 manages connections of host device 12 over Wi-Fi network 40. In other examples, connection processor 38 may manage a 3G or 4G modem connection, a global positioning system (GPS) connection, and/or a Bluetooth connection.

In some cases, the data stored in external memory 80 may be received from an external storage device, such a flash drive, via a peripheral interface, e.g., a universal serial bus (USB) interface or a secure digital (SD) card interface. Data stored in external memory 80 may also be received from storage or in real-time from a private network or a public network, e.g., the Internet, via connection processor 38. Application data manager 86 may move data for the applications from external memory 80 and local memory 82 for easier access by application processor 30. In addition, GPGPU 84 may perform any graphics processing for video game applications or other applications that require 3D representations.

Host device 12 also includes battery monitoring system 90 that monitors a battery status of host device 12. Battery monitoring system 90 may store battery status information that reflects whether host device 12 is wall plugged or using its battery reserve, and if using the battery reserve, the level of remaining battery power. In some cases, the battery status information may be displayed to the user of host device 12, e.g., using a small battery icon, lights or sounds to indicate different battery conditions. Battery monitoring system 90 may update the battery status information almost continuously to reflect an accurate battery status to the user of host device 12.

The components of host device 12 illustrated in FIG. 7 are merely exemplary. In other examples, host device 12 may include more, fewer, and/or different components. The components of host device 12 may be implemented as any of a variety of suitable circuitry, such as one or more microprocessors, digital signal processors (DSPs), application specific integrated circuits (ASICs), field programmable gate arrays (FPGAs), discrete logic, software, hardware, firmware or any combinations thereof. Display 44 in host device 12 may comprise one of a variety of display devices such as a liquid crystal display (LCD), a plasma display, an organic light emitting diode (OLED) display, or another type of display screen.

External memory 80 and local memory 82 in host device 12 may comprise any of a wide variety of volatile or non-volatile memory, including but not limited to random access memory (RAM) such as synchronous dynamic random access memory (SDRAM), read-only memory (ROM), non-volatile random access memory (NVRAM), electrically erasable programmable read-only memory (EEPROM), FLASH memory, and the like. External memory 80 and local memory 82 may comprise computer-readable storage media for storing media data, as well as other kinds of data. External memory 80 and local memory 82 additionally store instructions and program code that are executed by application processor 30 and/or multimedia processor 42 as part of performing the techniques described in this disclosure.

Figure 8:
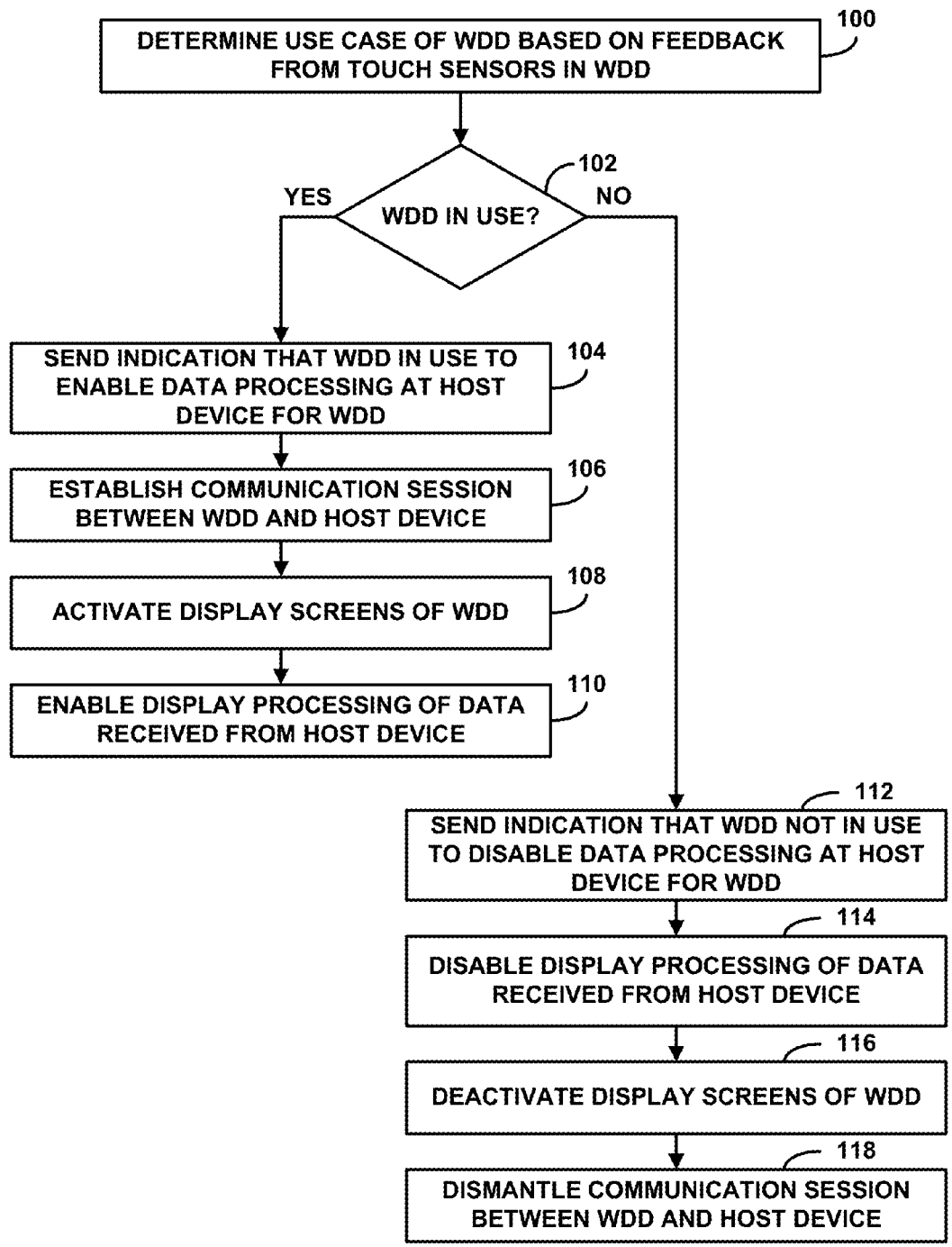
FIG. 8 is a flowchart illustrating an example operation of determining a use status of a wearable display connected to a host device, and controlling processing at the host device and the wearable display device based on the use status.

FIG. 8 is a flowchart illustrating an example operation of determining a use status of a wearable display device (WDD) connected to a host device, and controlling processing at the host device and the wearable display device based on the use status. The example operation is described with respect to wearable display device 16 connected to host device 12 from FIGS. 1 and 2.

Location sensing unit 20 of WDD 16 determines a use status of WDD 16 based on feedback received from one or more touch sensors 56 included in WDD 16 (100). Touch sensors 56 may be positioned on WDD 16 at locations that will be in contact or close proximity with the user when the user is wearing WDD 16 for use. In some examples, WDD 16 comprises a wireless head-mounted display (WHMD) device formed as glasses, as illustrated in FIG. 3, including at least one of the touch sensors, e.g., touch sensor 56C, located on a bridge of the glasses and at least two of the touch sensors, e.g., touch sensors 56A and 56B, located on temple arms of the glasses.

Location sensing unit 20 may include an oscillator circuit that uses a combination of resistors and capacitors to generate an oscillation frequency. In this example, each of touch sensors 56 connected to WDD 16 adds capacitance to the oscillator circuit. When one or more of touch sensors 56 are in contact with a surface of the user's body (e.g., the user's head or face), the feedback from touch sensors 56 comprises a faster capacitance discharge rate through the additional capacitors, which results in the oscillator circuit generating a higher oscillation frequency than when touch sensors 56 are not touched. In this example, location sensing unit 20 determines the use status of WDD 16 by generating an oscillation frequency based on the feedback from touch sensors 56 and comparing the resulting oscillation frequency to a threshold frequency value to determine whether the user is wearing WDD 16 for use.

When the oscillation frequency is greater than the threshold frequency value, location sensing unit 20 determines that WDD 16 is in use. On the contrary, when the oscillation frequency is less than or equal to the threshold frequency value, location sensing unit 20 determines that WDD 16 is not in use. Location sensing unit 20 will generate the highest oscillation frequency when all of touch sensors 56 are simultaneously in contact with a surface of the user's body, indicating that the user is wearing WDD 16 for use. The threshold frequency value, therefore, may be a preset value that is less than the highest oscillation frequency, but greater than an oscillation frequency generated when none of touch sensors 56 are in contact with a surface of the user's body. In some cases, the threshold frequency value may be preset such that location sensing unit 20 only determines that WDD 16 is in use when all of touch sensors 56 are in contact with the user. In other cases, the threshold frequency value may be preset such that location sensing unit 20 determines that WDD 16 is in use when at least one of touch sensors 56 is in contact with the user.

In some cases, location sensing unit 20 may continually determine the use status of WDD 16, and, either at fixed intervals or upon determining a change in the use status, send a direct processor interrupt request to controller 50 of WDD 16 indicating the use status of WDD 16. Controller 50, in turn, may send a virtual processor interrupt request to host device 12 indicating the use status of WDD 16. As one example, when location sensing unit 20 determines that WDD 16 is in use (YES branch of 102), controller 50 of WDD 16 sends an indication that WDD 16 is in use to host device 12 to enable data processing at host device 12 for display on WDD 16 (104).

Controller 50 of WDD 16 also controls its own operation based on the use status of WDD 16. For example, when location sensing unit 20 determines that WDD 16 is in use (YES branch of 102), controller 50 of WDD 16 may establish a communication session, e.g., a peer-to-peer (P2P) wireless connection, with host device 12 (106). In addition, controller 50 of WDD 16 may activate display screens 54 of WDD 16 (108).

Controller 50 of WDD 16 may also enable display processing by multimedia processor 52 of data received from host device 12 for display on WDD 16 (110). WDD 16 and host device 12 may continue operating in this full power state until location sensing unit 20 determines that WDD 16 is no longer in use by the user.

As another example, when location sensing unit 20 determines that WDD 16 is not in use (NO branch of 102), controller 50 of WDD 16 sends an indication that WDD 16 is not in use to host device 12 to disable data processing at host device 12 for display on WDD 16 (112). Controller 50 of WDD 16 also controls its own operation based on the use status of WDD 16. For example, when location sensing unit 20 determines that WDD 16 is not in use (NO branch of 102), WDD 16 may enter a reduced power state. In this case, controller 50 of WDD 16 may disable display processing by multimedia processor 52 of data received from host device 12 for display on WDD 16 (114). In addition, controller 50 of WDD 16 may deactivate display screens 54 of WDD 16 (116). Controller 50 of WDD 16 may also dismantle a communication session, e.g., a peer-to-peer (P2P) wireless connection, with host device 12 (118). WDD 16 and host device 12 may continue operating in this reduced power state until location sensing unit 20 determines that WDD 16 is in use by the user.

Figure 9:
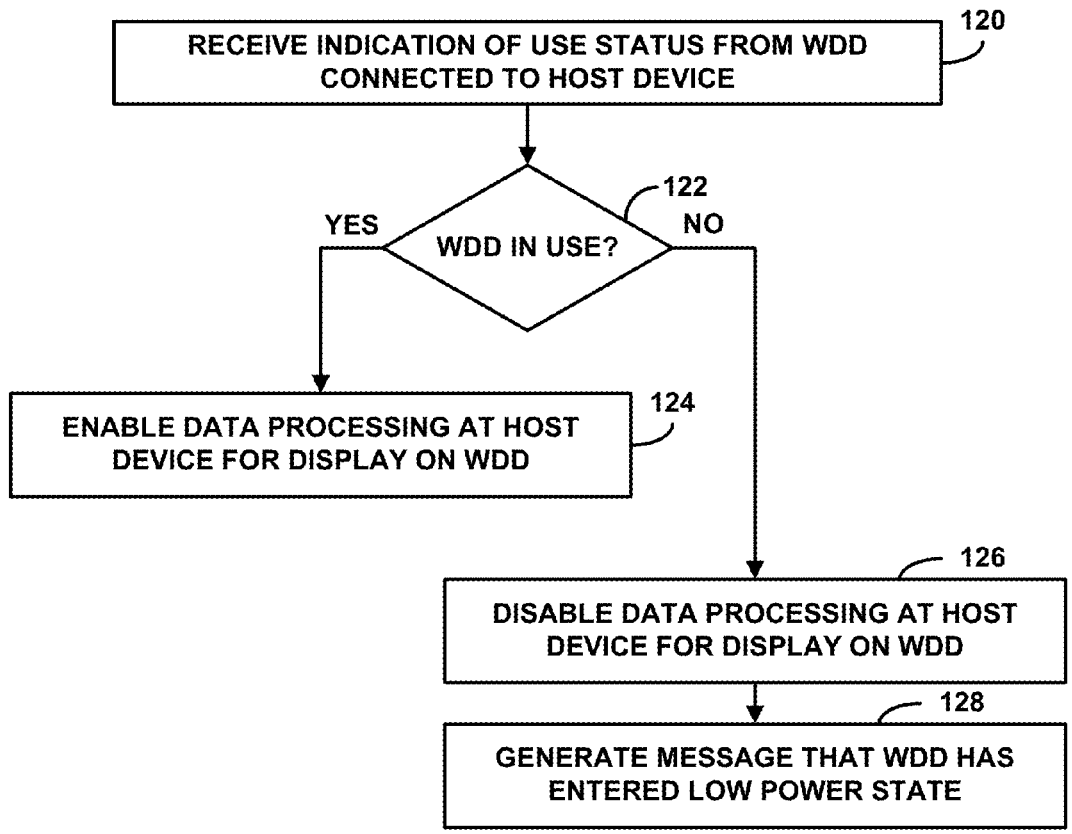
FIG. 9 is a flowchart illustrating an example operation of receiving an indication of a use status of a wearable display device at a host device, and controlling processing at the host device based on the indicated use status.

FIG. 9 is a flowchart illustrating an example operation of receiving an indication of a use status of a wearable display device (WDD) at a host device, and controlling processing at the host device based on the indicated use status. The example operation is described with respect to host device 12 connected to wearable display device 16 from FIGS. 1 and 2.

Host device 12 receives an indication of a use status of WDD 16 from controller 50 of WDD 16 (120). As described above with respect to FIG. 8, location sensing unit 20 of WDD 16 determines the use status of WDD 16 based on feedback received from one or more touch sensors 56 included in WDD 16 that indicate whether a user is wearing WDD 16 for use, and indicates the use status to controller 50 of WDD 16 using a direct processor interrupt request. In some cases, application processor 30 of host device 12 receives a virtual processor interrupt request from controller 50 of WDD 16 indicating the use status of WDD 16. Application processor 30 of host device 12 may receive the virtual processor interrupt requests indicating the use status of WDD 16 either at fixed intervals or upon a change in the use status of WDD 16.

Application processor 30 of host device 12 controls data processing at host device 12 for WDD 16 based on the use status of WDD 16. In some cases, application processor 30 may also control operation of a communication session, e.g., a peer-to-peer (P2P) wireless connection, with WDD 16 and data transmission to WDD 16 over the communication session based on the indicated use status of WDD 16. As one example, when host device 12 receives an indication that WDD 16 is in use (YES branch of 122), application processor 30 enables processing of data by multimedia processor 42 of host device 12 for display on WDD 16 (124). Host device 12 may continue operating in this full power state until application processor 30 of host device 12 receives an indication that WDD 16 is no longer in use by the user.

As another example, when host device 12 receives an indication that WDD 16 is not in use (NO branch of 122), application processor 30 disables processing of data by multimedia processor 42 of host device 12 for display on WDD 16 (126). In addition, application processor 30 may generate a message for the user of host device 12 and WDD 16 that WDD 16 has entered a reduced power state (128). In some examples, the generated message may be presented to the user on display 44 of host device 12. In this way, the user is notified that the WDD 16 has not been in use for some preset time period, and is automatically entering the reduced power state. Host device 12 may continue operating in this reduced power state until application processor 30 of host device 12 receives an indication that WDD 16 is in use by the user.

Figure 10:
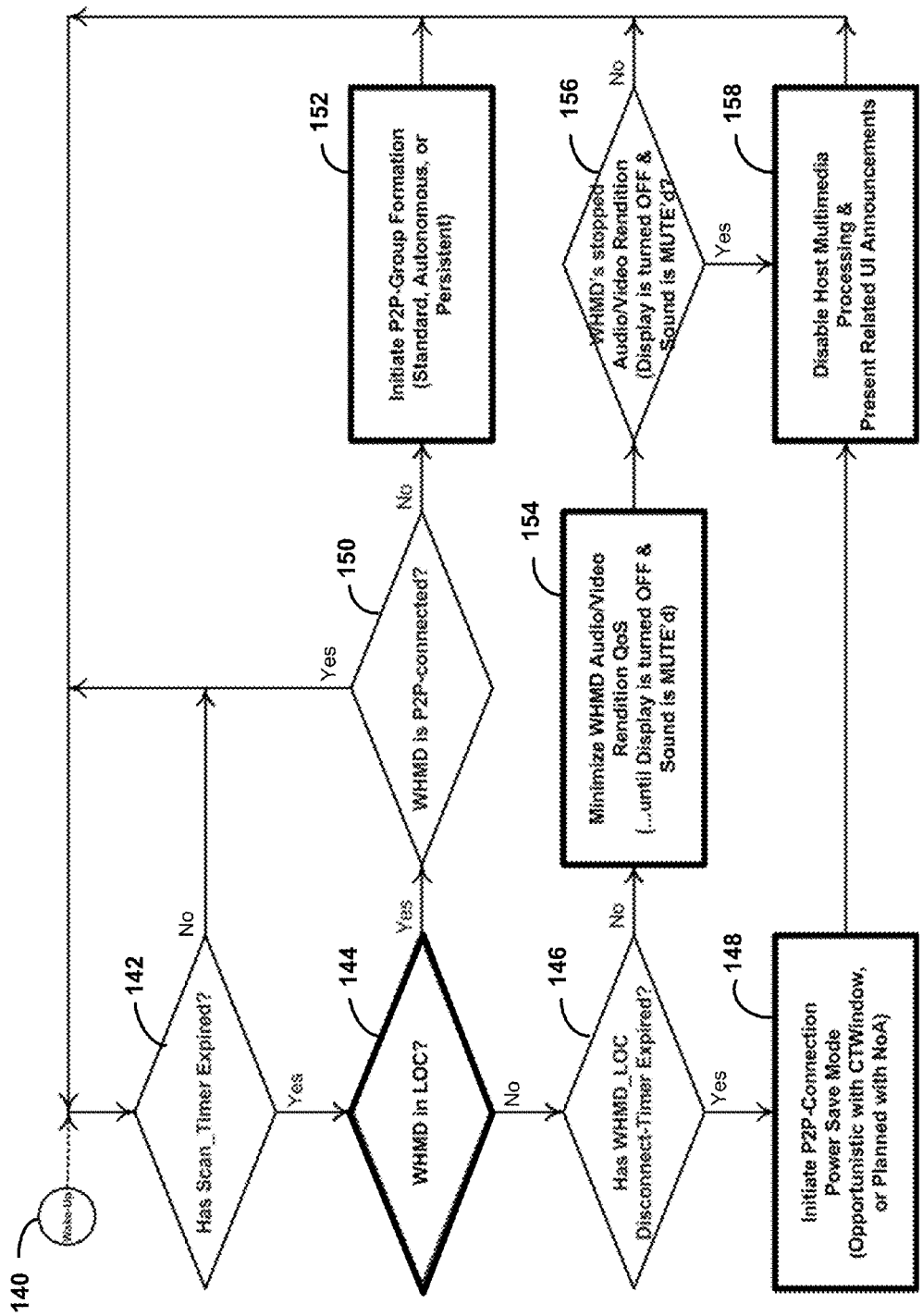
FIG. 10 is a flowchart illustrating an example operation of a location sensing unit included in a wireless head-mounted display (WHMD) device and related control mechanisms of the WHMD device.

FIG. 10 is a flowchart illustrating an example operation of a location sensing unit included in a wireless head-mounted display (WHMD) device and related control mechanisms of the WHMD device. The example operation is described with respect to wearable display device 16 as WHMD 16 including location sensing unit 20 and controller 50 from FIG. 2.

Beginning with a "wake-up" of WHMD 16 (140), location sensing unit 20 of WHMD 16 receives feedback from touch sensors 56 within WHMD 16 during a scan timer period. The wake-up mechanism may be the manual turning on of WHMD 16 by a user. The scan timer period may be a preset period of time during which location sensing unit 20 generates an oscillation frequency based on feedback from touch sensors 56. The scan timer period may allow the resulting oscillation frequency to stabilize before location sensing unit 20 makes a determination of the use status of WHMD 16.

When the scan timer expires (YES branch of 142), location sensing unit 20 determines whether WHMD 16 is in location, i.e., worn by a user for use (144). When WHMD 16 is in location (YES branch of 144), location sensing unit 20 sends a direct processor interrupt request to controller 50 of WHMD 16 to wake-up controller 50 and the other components of WHMD 16. If WHMD 16 is not P2P-connected to host device 12 (NO branch of 150), controller 50 may initiate establishment of a communication session, e.g., a P2P-group, with host device 12 (152). Once WHMD 16 is P2P-connected to host device 12 (YES branch of 150), controller 50 sends a virtual interrupt request to host device 12 indicating that WHMD 16 is in use to enable data processing at host device 12 for WHMD 16. Controller 50 may then control operation of WHMD 16 in a full power state, as described above with respect to FIG. 8. WHMD 16 may operate in the full power state until location sensing unit 20 determines that WHMD 16 is no longer worn by the user for use (144).

When WHMD 16 is not in location (NO branch of 144), location sensing unit 20 directs controller 50 to initiate a disconnect timer for WHMD 16 (146). The disconnect timer period may be a preset period of time during which controller 50 shuts down WHMD 16 prior to dismantling the P2P wireless connection with host device 12. For example, before the disconnect timer has expired (NO branch of 146), controller 50 may reduce or minimize display processing at WHMD 16 of AV data received from host device 12 until display screens 54 are deactivated and sound is muted (154). For example, controller 50 may reduce the quality of service (QoS) of the data rendering for display. Controller 50 also sends a virtual interrupt request to host device 12 indicating that WHMD 16 is not in use to disable data processing at host device 12 for WHMD 16. After the disconnect timer has expired (YES branch of 146), controller 50 may initiate the dismantling of the P2P wireless connection, i.e., a P2P-connection power save mode, between WHMD 16 and host device 12 (148).

Once controller 50 disables display processing of data at WHMD 16 (YES branch of 156) and dismantles the P2P wireless connection (148), WHMD 16 enters a reduced power state, as described above with respect to FIG. 8 until location sensing unit 20 determines that WHMD 16 is worn by the user for use. In addition, based on the indication from controller 50, host device 12 disables processing of data at host device 12 for WHMD 16 and generates user messages related to the reduced power state of WHMD 16 (158). WHMD 16 may operate in the reduced power state until location sensing unit 20 determines that WHMD 16 is worn by the user for use (144).

In one or more examples, the functions described may be implemented in hardware, software, firmware, or any combination thereof. If implemented in software, the functions may be stored on or transmitted over as one or more instructions or code on a computer-readable medium. Computer-readable media may include computer data storage media or communication media including any medium that facilitates transfer of a computer program from one place to another. In some examples, computer-readable media may comprise non-transitory computer-readable media. Data storage media may be any available media that can be accessed by one or more computers or one or more processors to retrieve instructions, code and/or data structures for implementation of the techniques described in this disclosure.

By way of example, and not limitation, such computer-readable media can comprise non-transitory media such as RAM, ROM, EEPROM, CD-ROM or other optical disk storage, magnetic disk storage, or other magnetic storage devices, flash memory, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The code may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various embodiments of the invention have been described. These and other embodiments are within the scope of the following claims.

What is claimed is:

1. A method of controlling a host device connected to a wearable display device, the method comprising:
   determining, with the wearable display device, a use status of the wearable display device;
   determining, with the wearable display device, a manner in which a processor of the host device is to modify data processing to be performed by the host device; and
   sending, with the wearable display device, an indication of the use status of the wearable display device to the host device to control the data processing to be performed at the host device to generate data for presentation on the wearable display device based on the indication of the use status of the wearable display device,
   wherein sending the indication of the use status of the wearable display device to the host device comprises sending, based on the wearable display device not being in use, a request to the processor of the host device to modify the data processing to be performed by the host device, in the manner determined by the wearable display device, to generate the data for presentation on the wearable display device, and
   wherein sending the request to the processor of the host device to modify data processing to be performed by the host device, in the manner determined by the wearable display device, to generate the data for presentation on the wearable display device comprises sending the request to the processor of the host device to one of enable, disable or reduce data processing to be performed by the host device to generate the data for presentation on the wearable display device.

2. The method of claim 1, wherein determining the use status of the wearable display device comprises:
   generating an oscillation frequency based on feedback from one or more touch sensors of the wearable display device, wherein the oscillation frequency changes when the one or more touch sensors are in contact with the user; and
   based on a comparison of the oscillation frequency and a threshold frequency value, determining whether the wearable display device is in use or not in use.

3. The method of claim 1, wherein determining the use status of the wearable display device comprises continuously determining the use status of the wearable display device.

4. The method of claim 1, further comprising controlling, with the wearable display device, operation of the wearable display device based on the use status of the wearable display device, wherein controlling operation of the wearable display device comprises controlling operation of one or more display screens of the wearable display device, a communication session with the host device, and display processing of data received from the host device.

5. The method of claim 1, wherein sending the request to the processor of the host device to one of enable, disable or reduce data processing to be performed by the host device comprises sending a virtual processor interrupt request to the processor of the host device.

6. The method of claim 1, wherein determining the use status of the wearable display device comprises determining that the wearable display device is in use, the method further comprising based on the wearable display device being in use:
   establishing a communication session with the host device,
   activating one or more display screens of the wearable display device, and
   enabling display processing of data received from the host device.

7. The method of claim 1, wherein determining the use status of the wearable display device comprises determining that the wearable display device is in use, the method further comprising requesting, based on the wearable display device being in use, the processor of the host device to enable data processing at the host device to generate the data for presentation on the wearable display device.

8. The method of claim 1, wherein determining the use status of the wearable display device comprises determining that the wearable display device is not in use, the method further comprising entering a reduced power state.

9. The method of claim 1, wherein determining the use status of the wearable display device comprises determining that the wearable display device is not in use, the method further comprising one or more of disabling display processing of data received from the host device, deactivating one or more display screens of the wearable display device, and dismantling a communication session with the host device.

10. The method of claim 9, further comprising:
    initiating a disconnect timer;
    prior to expiration of the disconnect timer, reducing display processing of data received from the host device until the one or more display screens are deactivated; and
    upon expiration of the disconnect timer, dismantling the communication session with the host device.

11. The method of claim 1, wherein the wearable display device comprises a wireless head-mounted display (WHMD) device formed as glasses that include at least one touch sensor located on a bridge of the glasses and at least two touch sensors located on temple arms of the glasses.

12. The method of claim 1, wherein sending the request to the processor of the host device to one of enable, disable or reduce data processing to be performed by the host device comprises sending an interrupt request to the processor of the host device to one of enable, disable or reduce data processing to be performed by the host device to generate the data for presentation on the wearable display device.

13. A wearable display device connected to a host device, the wearable display device comprising:
    one or more display screens; and
    one or more processors configured to determine a use status of the wearable display device, determine a manner in which a processor of the host device is to modify data processing to be performed by the host device, and send an indication of the use status of the wearable display device to the host device to control the data processing to be performed at the host device to generate data for presentation on the one or more display screens of the wearable display device based on the indication of the use status of the wearable display device, wherein the one or more processors are configured to send, based on the wearable display device not being in use, a request to the processor of the host device to modify the data processing to be performed by the host device, in the manner determined by the wearable display device, to generate the data for presentation on the wearable display device, and wherein to send the request to the processor of the host device to modify processing to be performed by the host device, in the manner determined by the wearable display device, to generate the data for presentation on the wearable display device, the one or more processors are configured to send the request to the processor of the host device to one of enable, disable or reduce data processing to be performed by the host device to generate the data for presentation on the wearable display device.

14. The wearable display device of claim 13, further comprising one or more touch sensors, wherein the one or more processors are configured to:
generate an oscillation frequency based on feedback from the touch sensors of the wearable display device, wherein the oscillation frequency changes when the touch sensors are in contact with the user; and
based on a comparison of the oscillation frequency and a threshold frequency value, determine whether the wearable display device is in use or not in use.

15. The wearable display device of claim 13, wherein the one or more processors are configured to continuously determine the use status of the wearable display device.

16. The wearable display device of claim 13, wherein the one or more processors are configured to control operation of the one or more display screens of the wearable display device, a communication session with the host device, and display processing of data received from the host device.

17. The wearable display device of claim 13, wherein to send the request to the processor of the host device to one of enable, disable or reduce data processing to be performed by the host device, the one or more processors are configured to send a virtual processor interrupt request to the processor of the host device.

18. The wearable display device of claim 13, wherein, based on the wearable display device being in use, the one or more processors are configured to one or more of establish a communication session with the host device, activate the one or more display screens of the wearable display device, and enable display processing of data received from the host device.

19. The wearable display device of claim 13, wherein, based on the wearable display device being in use, the one or more processors are configured to request the processor of the host device to enable data processing at the host device to generate the data for presentation on the wearable display device.

20. The wearable display device of claim 13, wherein, based on the wearable display device not being in use, the one or more processors are configured to enter a reduced power state.

21. The wearable display device of claim 13, wherein, based on the wearable display device not being in use, the one or more processors are configured to one or more of disable display processing of data received from the host device, deactivate the one or more display screens of the wearable display device, and dismantle a communication session with the host device.

22. The wearable display device of claim 21, wherein the one or more processors are configured to:
initiate a disconnect timer;
prior to expiration of the disconnect timer, reduce display processing of data received from the host device until the one or more display screens are deactivated; and
upon expiration of the disconnect timer, dismantle the communication session with the host device.

23. The wearable display device of claim 13, wherein the wearable display device comprises a wireless head-mounted display (WHMD) device formed as glasses that include at least one touch sensor located on a bridge of the glasses and at least two touch sensors located on temple arms of the glasses.

24. The wearable display device of claim 13, wherein to send the request to the processor of the host device to one of enable, disable or reduce data processing to be performed by the host device, the one or more processors are configured to send an interrupt request to the processor of the host device to one of enable, disable or reduce data processing to be performed by the host device to generate the data for presentation on the wearable display device.

25. A wearable display device connected to a host device, the wearable display device comprising:
means for determining a use status of the wearable display device;
means for determining a manner in which a processor of the host device is to modify data processing to be performed by the host device; and
means for sending an indication of the use status of the wearable display device to the host device to control the data processing to be performed at the host device to generate data for presentation on the wearable display device based on the indication of the use status of the wearable display device,
wherein the means for sending comprises means for sending, based on the wearable display device not being in use, a request to the processor of the host device to modify the data processing to be performed by the host device, in the manner determined by the wearable display device, to generate the data for presentation on the wearable display device, and
wherein the means for sending the request to the processor of the host device to modify processing to be performed by the host device, in the manner determined by the wearable display device, to generate the data for presentation on the wearable display device comprises means for sending the request to the processor of the host device to one of enable, disable or reduce data processing to be performed by the host device to generate the data for presentation on the wearable display device.

26. The wearable display device of claim 25, further comprising means for continuously determining the use status of the wearable display device.

27. The wearable display device of claim 25, further comprising means for controlling operation of one or more display screens of the wearable display device, a communication session with the host device, and display processing of data received from the host device.

28. The wearable display device of claim 25, wherein the means for sending the request to the processor of the host device to one of enable, disable or reduce data processing to be performed by the host device comprises means for sending a virtual processor interrupt request to the processor of the host device.

29. The wearable display device of claim 25, wherein the means for sending the request to the processor of the host device to one of enable, disable or reduce data processing to be performed by the host device comprises means for sending an interrupt request to the processor of the host device to one of enable, disable or reduce data processing to be performed by the host device.

30. A non-transitory computer-readable medium comprising instructions for controlling a wearable display device connected to a host device, the instructions when executed cause one or more programmable processors to:
   determine, with the wearable display device, a use status of the wearable display device;
   determine, with the wearable display device, a manner in which a processor of the host device is to modify data processing to be performed by the host device; and
   send, with the wearable display device, an indication of the use status of the wearable display device to the host device to control the data processing to be performed at the host device to generate data for presentation on the wearable display device based on the indication of the use status of the wearable display device,
   wherein the instructions that when executed cause the one or more programmable processors to send comprise instructions that when executed cause the one or more programmable processors to send, based on the wearable display device not being in use, a request to the processor of the host device to modify the data processing to be performed by the host device, in the manner determined by the wearable display device, to generate the data for presentation on the wearable display device, and
   wherein the instructions that when executed cause the one or more programmable processors to send the request to the processor of the host device to modify processing to be performed by the host device, in the manner determined by the wearable display device, to generate the data for presentation on the wearable display device comprise instructions that when executed cause the one or more programmable processors to send the request to the processor of the host device to one of enable, disable or reduce data processing to be performed by the host device to generate the data for presentation on the wearable display device.

* * * * *